United States Patent
Baek et al.

(10) Patent No.: US 9,559,715 B2
(45) Date of Patent: Jan. 31, 2017

(54) SUCCESSIVE APPROXIMATION RESISTER ANALOG-TO-DIGITAL CONVERTER HAVING SEPARABLE DUAL CAPACITOR ARRAY

(71) Applicant: CHUNG-ANG UNIVERSITY INDUSTRY-ACADEMY COOPERATION FOUNDATION, Seoul (KR)

(72) Inventors: Kwang Hyun Baek, Seoul (KR); Seong Jin Cho, Incheon (KR); Ju Eon Kim, Uijeongbu-si (KR); Chang Woo Lee, Seoul (KR)

(73) Assignee: CHUNG-ANG UNIVERSITY INDUSTRY-ACADEMY COOPERATION FOUNDATION, Seoul (KR)

( * ) Notice: Subject to any disclaimer, the term of this patent is extended or adjusted under 35 U.S.C. 154(b) by 0 days.

(21) Appl. No.: 15/025,156

(22) PCT Filed: Apr. 9, 2015

(86) PCT No.: PCT/KR2015/003547
§ 371 (c)(1),
(2) Date: Mar. 25, 2016

(87) PCT Pub. No.: WO2016/017898
PCT Pub. Date: Feb. 4, 2016

(65) Prior Publication Data
US 2016/0226507 A1    Aug. 4, 2016

(30) Foreign Application Priority Data
Jul. 31, 2014 (KR) .................. 10-2014-0098596

(51) Int. Cl.
*H03M 1/38* (2006.01)
*H03M 1/12* (2006.01)
(Continued)

(52) U.S. Cl.
CPC ............ *H03M 1/38* (2013.01); *H03M 1/1245* (2013.01); *H03M 1/466* (2013.01); *H03M 1/468* (2013.01); *H03M 1/68* (2013.01)

(58) Field of Classification Search
CPC ...... H03M 1/38; H03M 1/1245; H03M 1/466; H03M 1/68; H03M 1/468
(Continued)

(56) References Cited

U.S. PATENT DOCUMENTS

| 5,581,252 A | 12/1996 | Thomas |
| 8,004,447 B2 * | 8/2011 | Hsu .................. H03M 1/16 341/155 |

(Continued)

FOREIGN PATENT DOCUMENTS

| KR | 1019890004506 B1 | 7/1998 |
| KR | 10201400087375 A | 7/2014 |
| KR | 1020140057027 A | 9/2014 |

OTHER PUBLICATIONS

International Search Report mailed Aug. 4, 2015 corresponding to International Application No. PCT/KR2015/003547, citing the above reference(s).

*Primary Examiner* — Brian Young
(74) *Attorney, Agent, or Firm* — Hauptman Ham, LLP

(57) ABSTRACT

A successive approximation register analog-to-digital converter including separable dual capacitor array is disclosed. The disclosed successive approximation register analog-to-digital converter comprises: a dual capacitor array configured to include a first capacitor array for converting most significant bits of n bits and a second capacitor array for
(Continued)

converting least significant bits of the n bits; a comparator configured to compare a level signal outputted from the first capacitor array with a level signal outputted from the second capacitor array; and an SAR logic circuit configured to convert an analog input voltage into a digital signal having the n bits by using the comparison result. Here, the first capacitor array includes a 1-1 capacitor circuit and a 1-2 capacitor circuit and the second capacitor array includes a 2-1 capacitor circuit and a 2-2 capacitor circuit. Each of the capacitor circuits includes capacitors connected in parallel each other.

6 Claims, 3 Drawing Sheets

(51) Int. Cl.
  *H03M 1/46* (2006.01)
  *H03M 1/68* (2006.01)
(58) Field of Classification Search
  USPC .......................................... 341/161, 155, 122
  See application file for complete search history.

(56) References Cited

U.S. PATENT DOCUMENTS

| | | | | |
|---|---|---|---|---|
| 8,797,204 B2* | 8/2014 | Yoon | ........................ | H03M 1/16 341/155 |
| 8,842,027 B2* | 9/2014 | Huang | ................. | H03M 1/1057 341/120 |
| 9,083,375 B1* | 7/2015 | Chang | ................... | H03M 1/125 |
| 9,287,891 B1* | 3/2016 | Lee | ..................... | H03M 1/0641 |
| 9,319,059 B1* | 4/2016 | Sharma | ................... | H03M 1/38 |

* cited by examiner

SUCCESSIVE APPROXIMATION RESISTER ANALOG-TO-DIGITAL CONVERTER HAVING SEPARABLE DUAL CAPACITOR ARRAY

TECHNICAL FIELD

The present disclosure relates to a successive approximation register analog-to-digital converter SAR ADC, more particularly relates to a successive approximation register analog to digital converter including a dual capacitor array for reducing causative switching energy of much power consumption in conventional successive approximation register analog-to-digital converter with single-ended structure.

BACKGROUND ART

An analog-to-digital converter ADC means an apparatus for receiving an analog signal showed with successive values and converting the analog signal into a digital signal (n bits) showed with discrete positive value. The ADC includes a pipelined ADC, a successive approximation register SAR and an algorithmic ADC, etc.

FIG. 1 and FIG. 2 are views illustrating concept of a successive approximation register using conventional dual capacitor array.

Referring to FIG. 1, the conventional successive approximation register 100 using a dual capacitor array includes a dual capacitor array 110, a comparator 120 and an SAR logic circuit 130. Here, the successive approximation register 100 performs a sampling operation and a hold operation for converting a digital signal.

The capacitor 110 includes a first capacitor 110-1 for converting most significant bits MSBs of n bits and a second capacitor array 110-2 for converting lease significant bits LSBs of the n bits.

Particularly, one terminal of the second capacitor array 110-2 is connected to a ground in the event that the conventional successive approximation register 100 performs the sampling operation as shown in (a) in FIG. 1, and a reference voltage is applied to one terminal of the second capacitor array 110-2 in the event that the conventional successive approximation register 100 performs the hold operation as shown in (b) in FIG. 1.

That is, the dual capacitor array of the conventional successive approximation register 100 with single-ended structure separates the first capacitor array 110-1 for the MSB and the second capacitor array 110-2 for the LSB, thereby reducing switching energy.

However, the problem exists in that 90% or more of total switching energy is consumed ($E = 256 C_0 V_{REF}^2$) during the sampling process and the hold process in the conventional successive approximation register 100 with the dual capacitor array, as shown in FIG. 2.

SUMMARY

To solve problem of the convention technique, the invention is to provide a successive approximation register analog-to-digital converter including a dual capacitor array for reducing causative switching energy of much power consumption in the conventional successive approximation register analog-to-digital converter having single-ended structure.

Other objects of the invention may be induced by a person in the art through following embodiments.

A successive approximation register analog-to-digital converter according to one embodiment of the invention comprises: a dual capacitor array configured to include a first capacitor array for converting most significant bits of n bits and a second capacitor array for converting least significant bits of the n bits; a comparator configured to compare a level signal outputted from the first capacitor array with a level signal outputted from the second capacitor array; and an SAR logic circuit configured to convert an analog input voltage into a digital signal having the n bits by using the comparison result. Here, wherein the first capacitor array includes a 1-1 capacitor circuit and a 1-2 capacitor circuit and the second capacitor array includes a 2-1 capacitor circuit and a 2-2 capacitor circuit. Each of the capacitor circuits includes capacitors connected in parallel each other.

The successive approximation register analog-to-digital converter performs a sampling operation and a hold operation. Here, the successive approximation register analog-to-digital converter further includes a first MOS switch and a second MOS switch for shifting the analog input voltage sampled in the sampling operation.

One of the analog input voltage to a reference voltage is applied to one terminals of capacitors in the 1-1 capacitor circuit, one of the analog input voltage ground voltage is applied to one terminals of capacitors in the 1-2 capacitor circuit, the other terminals of the capacitors in the 1-1 capacitor circuit and the other terminals in the 1-2 capacitor circuit are connected to a first input terminal of the comparator, the reference voltage is applied to a source electrode of the first MOS switch, a drain electrode of the first MOS switch is connected to the first input terminal of the comparator, and one of voltages corresponding to K times the ground voltage to the analog input voltage is applied to a gate electrode of the first MOS switch.

In the sampling operation, the analog input voltage is applied to the one terminals of the capacitors in the 1-1 capacitor circuit and the one terminals of the capacitors in the 1-2 capacitor circuit and the ground voltage is applied to the gate electrode of the first MOS switch, and in the hold operation, the reference voltage is applied to the one terminals of the capacitor in the 1-1 capacitor circuit, the one terminals of the capacitors in the 1-2 capacitor circuit are connected to a ground, and a voltage corresponding to K times the analog input voltage is applied to the gate electrode of the first MOS switch.

A reference voltage is applied to one terminals of capacitors in the 2-1 capacitor circuit, a ground voltage is applied to one terminals of capacitors in the 2-2 capacitor circuit, the other terminals of the capacitors in the 2-1 capacitor circuit and the other terminals of the capacitors in the 2-2 capacitor circuit are connected to second input terminal of the comparator, the reference voltage is applied to a source electrode of the second MOS switch, a drain electrode of the second MOS switch is connected to the second input terminal of the comparator, and one of the ground voltage to the analog input voltage is applied to a gate electrode of the second MOS switch.

The ground voltage is applied to a gate electrode of the second MOS switch in the sampling operation, and the analog input voltage is applied to the gate electrode of the second MOS switch in the hold operation.

A successive approximation register analog-to-digital converter according to another embodiment of the invention comprises: a dual capacitor array configured to include a first capacitor array for converting most significant bits and a second capacitor array for converting least significant bits; a comparator configured to compare a level signal outputted from the first capacitor array with a level signal outputted from the second capacitor array; and an SAR logic circuit configured to convert an analog input voltage into a digital signal having n bit by using the comparison result. Here, the first capacitor array includes a 1-1 capacitor circuit and a 1-2 capacitor circuit, each of the capacitor circuits includes capacitors connected in parallel each other, the successive approximation register analog-to-digital converter performs a sampling operation and a hold operation. The analog input voltage is applied to one terminals of capacitors in the 1-1 capacitor circuit and one terminals of capacitors in the 1-2 capacitor circuit in the sampling operation, and a reference voltage is applied to the one terminals of the capacitors in the 1-1 capacitor circuit and the one terminals of the capacitors in the 1-2 capacitor circuit are connected to a ground in the hold operation.

A successive approximation register analog-to-digital converter including a dual capacitor array according to the invention may reduce causative switching energy of much power consumption in the conventional successive approximation register analog-to-digital converter having single-ended structure.

BRIEF DESCRIPTION OF DRAWINGS

Example embodiments of the present invention will become more apparent by describing in detail example embodiments of the present invention with reference to the accompanying drawings, in which.

DETAILED DESCRIPTION

Figure 1:
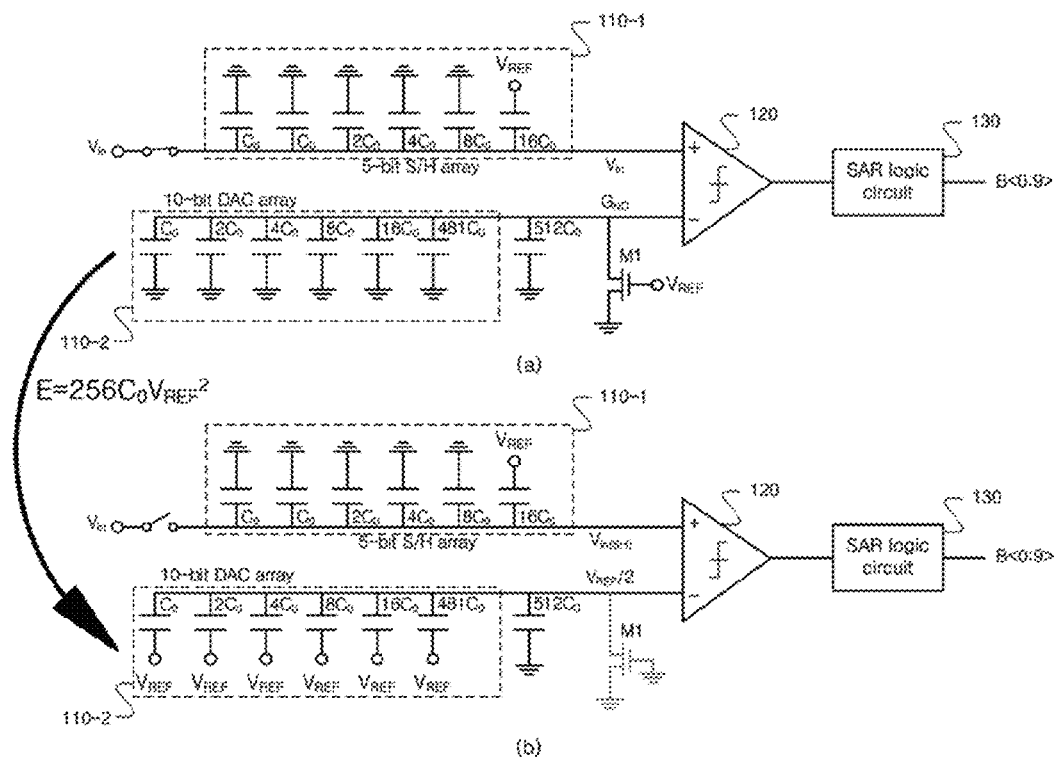
FIG. 1 and FIG. 2 are views illustrating concept of a successive approximation register using conventional dual capacitor array.

The invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention. Like numbers refer to like elements throughout the description of the figures.

Hereinafter, embodiments of the invention will be described in detail with reference to accompanying drawings.

Figure 3:
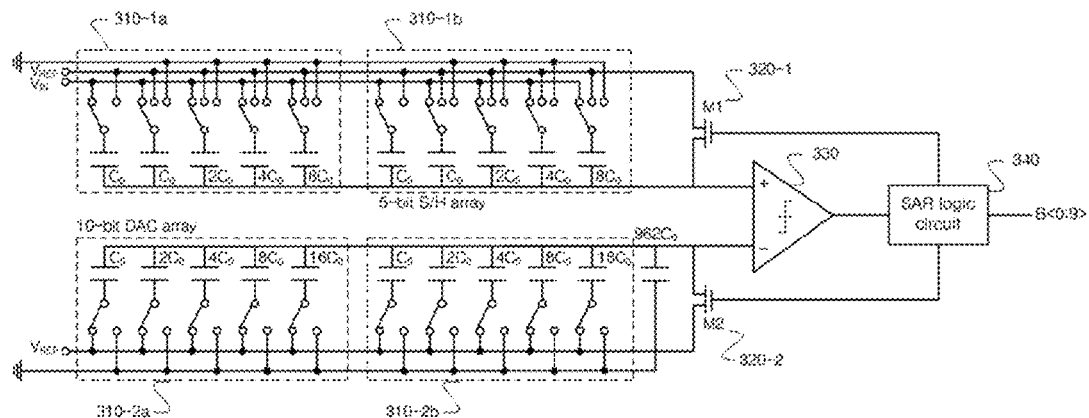
FIG. 3 and FIG. 4 are views illustrating detailed structure of a successive approximation register analog-to-digital converter according to one embodiment of the invention.

FIG. 3 is a view illustrating detailed structure of a successive approximation register analog-to-digital converter according to one embodiment of the invention.

In FIG. 3, the successive approximation register analog-to-digital converter 300 of the present embodiment includes a dual capacitor array 310, two MOS switches 320, a comparator 330 and an SAR logic circuit 340. Hereinafter, function of the elements will be described in detail.

The dual capacitor array 310 includes switched capacitors, and generates a level voltage. The level voltage means a voltage generated by dividing a reference voltage $V_{REF}$ according to digital resolution of an analog-to-digital converter and compared with an analog input voltage $V_{IN}$.

Here, the dual capacitor array 310 includes a first capacitor array 310-1 for converting most significant bits MSBs of n bits and a second capacitor array 310-2 for converting least significant bits LSBs of the n bits. The successive approximation register analog-to-digital converter 300 performs a sampling operation and a hold operation as described above.

The first MOS switch 320-1 and the second MOS switch 320-2 shift an analog input voltage sampled in the sampling operation.

The comparator 330 compares a level signal outputted from the first capacitor array 310-1 with a level signal outputted from the second capacitor array 310-2 and generates a HIGH signal or a LOW signal according to the comparison result.

The SAR logic circuit 340 converts the analog input voltage into a digital signal having n bits by using the comparison result of the comparator 330.

Hereinafter, the dual capacitor array 310 and two MOS switches 320 will be described detail.

Separable two capacitor circuits exist each of the first capacitor array 310-1 and the second capacitor array 310-2 included in the dual capacitor array 310.

That is, the first capacitor array 310-1 includes a 1-1 capacitor circuit 310-1a and a 1-2 capacitor circuit 310-1b, wherein the 1-1 capacitor circuit 310-1a and the 1-2 capacitor circuit 310-1b have the same structure. Additionally, the second capacitor array 310-2 includes a 2-1 capacitor circuit 310-2a and a 2-2 capacitor circuit 310-2b wherein the 2-1 capacitor circuit 310-2a and the 2-2 capacitor circuit 310-2b have the same structure.

Here, capacitors in the dual capacitor array 310 and two MOS switches 320 have different connection relation based on the sampling operation and the hold operation.

In one embodiment, one of the analog input voltage $V_{IN}$ to the reference voltage $V_{REF}$ may be applied to one terminals of capacitors included in the 1-1 capacitor circuit 310-1a, one of the analog input voltage $V_{IN}$ to a ground voltage may be applied to one terminals of capacitors included in the 1-2 capacitor circuit 310-1b, and the other terminals of the capacitors in the 1-1 capacitor circuit 310-1a and the other terminals of the capacitors in the 1-2 capacitor circuit 310-1b may be connected to a first input terminal (+ terminal) of the comparator 330. Furthermore, the reference voltage $V_{REF}$ may be applied to a source electrode of the first MOS switch 320-1a drain electrode the first MOS switch 320-1 may be connected to the first input terminal of the comparator 330, and one of voltages corresponding to K times the ground voltage to the reference voltage $V_{REF}$ (for example, two times the reference voltage $V_{REF}$ ($2V_{REF}$)) may be applied to a gate electrode of the first MOS switch 320-1. Here, a voltage outputted from the SAR logic circuit 340 may he applied to the gate electrode of the first MOS switch 320-1.

In one embodiment, the reference voltage $V_{REF}$ may be applied to one terminals of capacitors included in the 2-1 capacitor circuit 310-2a, the ground voltage may be applied to one terminals of capacitors included in the 2-2 capacitor circuit 310-2b, and the other terminals of the capacitors in the 2-1 capacitor circuit 310-2a and the other terminals of the capacitors in the 2-2 capacitor circuit 310-2b may be connected to a second input terminal (− terminal) of the comparator 330. Moreover, the reference voltage $V_{REF}$ may be applied to a source electrode of the second MOS switch 320-2, a drain electrode of the second MOS switch 320-2 may be connected to the second input terminal of the comparator 330, and one of the ground voltage to the reference $V_{REF}$ may be applied to a gate electrode of the second MOS switch 320-2. Here, the voltage outputted from the SAR logic circuit 340 may be applied to the gate electrode of the second MOS switch 320-2.

Hereinafter, connection relation of the capacitors and MOS switches will be described in detail.

Figure 4:
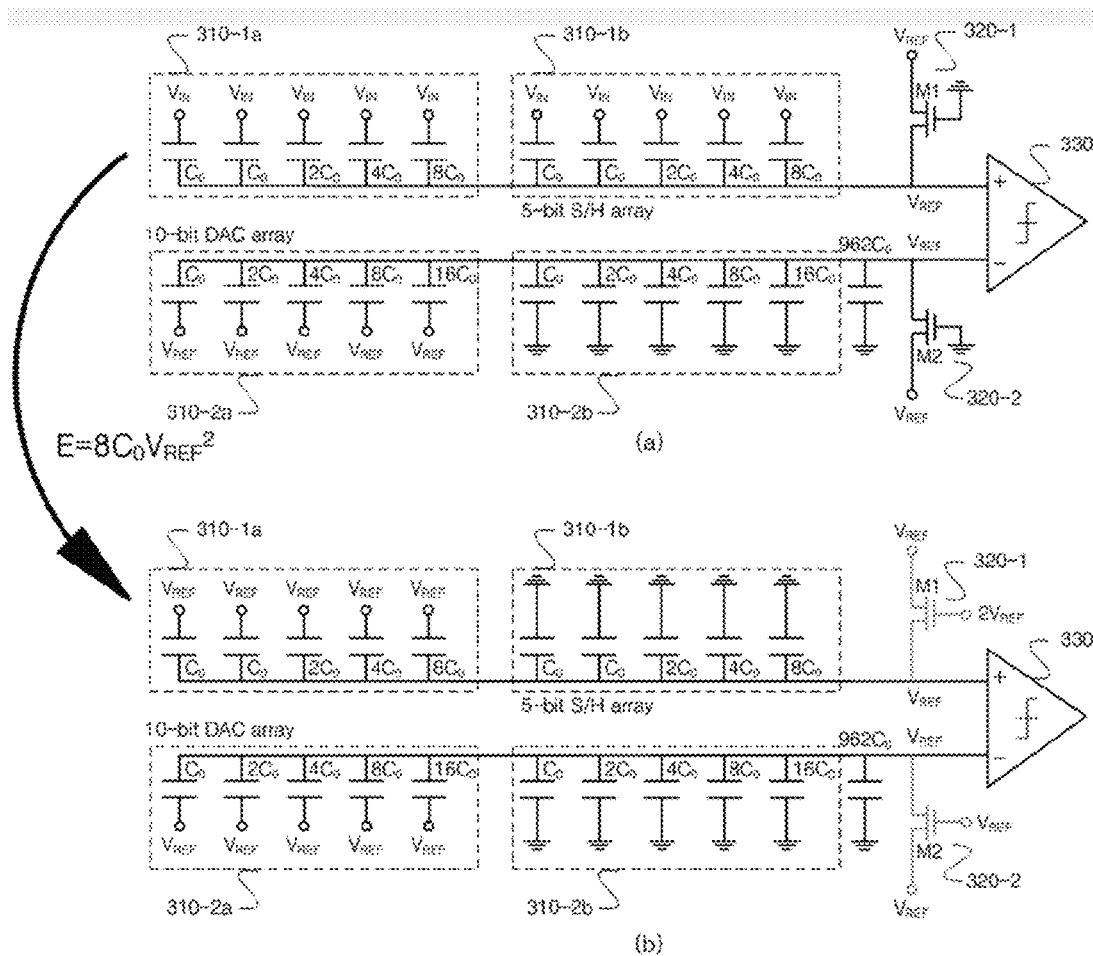

(a) in FIG. 4 is a view illustrating connection relation of the capacitors and the MOS switch in the sampling process according to one embodiment of the invention, and (b) in FIG. 4 is a view illustrating connection relation of the capacitors and the MOS switch in the hold process according to one embodiment of the invention.

Referring to (a) in FIG. 4, in the sampling operation, the analog input voltage $V_{IN}$ may be applied to the one terminals of the capacitors in the 1-1 capacitor circuits 310-1a and the one terminals of the capacitors in the 1-2 capacitor circuits 310-1b, and the ground voltage may be applied to the gate electrode of the first MOS switch 320-1. In addition, the reference voltage $V_{REF}$ may be applied to the one terminals of the capacitors in the 2-1 capacitor circuit 310-2a, the ground voltage may be applied to the one terminals of the 2-2 capacitor circuit 310-2b, and the ground voltage may be applied to the gate electrode of the second MOS switch 320-2.

Referring to (b) in FIG. 4, in the hold operation, the reference voltage $V_{REF}$ may be applied to the one terminals of the capacitors in the 1-1 capacitor circuits 310-1a, the ground voltage may be applied to the one terminals of the capacitors in the 1-2 capacitor circuit 310-1b, and a voltage corresponding to K times the reference voltage $V_{REF}$ (for example, two times the reference voltage $V_{REF}$ ($2V_{REF}$)) may be applied to the gate electrode of the first MOS switch 320-1. Furthermore, the reference voltage $V_{REF}$ may be applied to the one terminals of the capacitors in the 2-1 capacitor circuit 310-2a, the ground voltage may be applied to the one terminals of the 2-2 capacitor circuit 310-2b, and the reference voltage $V_{REF}$ may be applied to the gate electrode of the second MOS switch 320-2.

Figure 2:
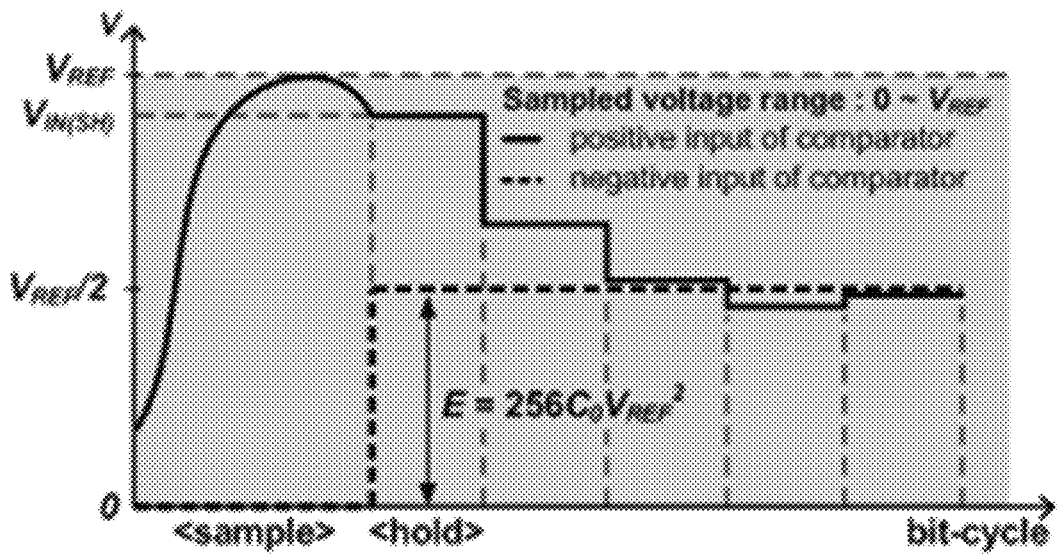

Hereinafter, the conventional successive approximation register analog-to-digital converter 100 shown in FIG. 1 and FIG. 2 and the successive approximation register analog-do-digital converter 300 of the invention will be compared.

As describe above, in the conventional successive approximation register analog-to-digital converter 100, for example a voltage level $V_{REF}/2$ is generated for MSB. FIG. 2 shows a process of discriminating next bits according as bit-cycle is sequentially progressed. In this time, the problem exists that 90% or more of the total switching energy is consumed in the hold process because the switching energy E of $256C_0V_{REF}^2$ generates.

Figure 5:
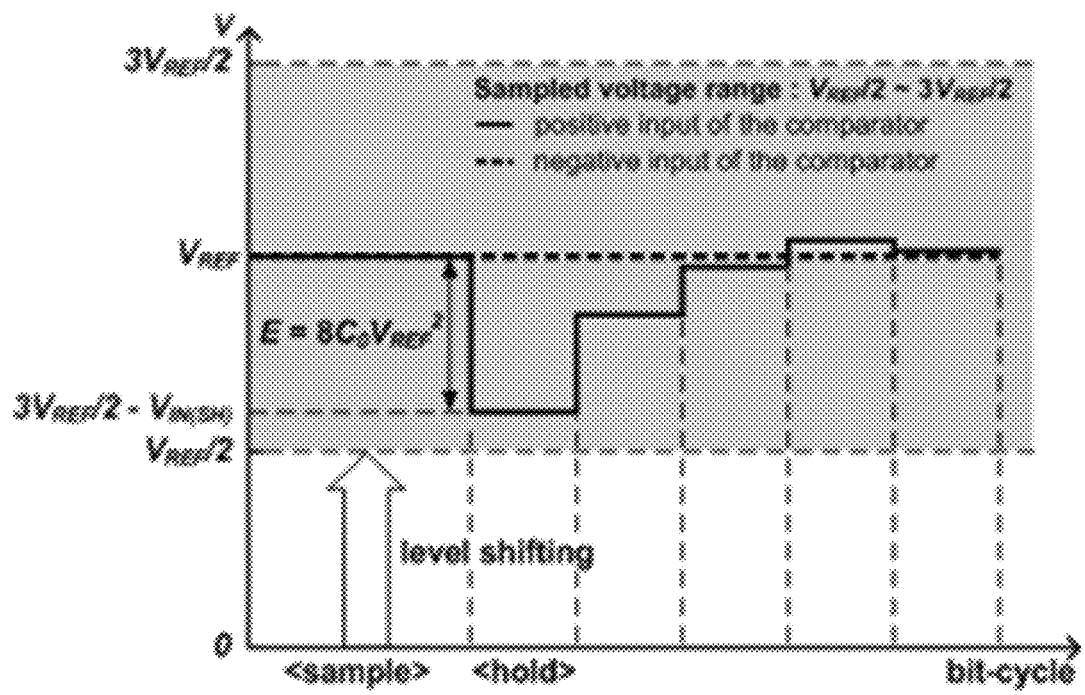
FIG. 5 is a view illustrating a graph for describing effect of the successive approximation register analog-to-digital converter according to one embodiment of the invention.

In the successive approximation register analog-to-digital converter 300 of the invention, it is verified through FIG. 4 and FIG. 5 that considerable little switching energy E of $8C_0V_{REF}^2$ generates in the sampling process and the hold process. Furthermore, the successive approximation register analog-to-digital converter 300 employs a split structure (means a structure where each of capacitors is divided into two capacitors having the same size), and so the switching energy generated during the bit-cycle process may be further reduced. That is, the successive approximation register analog-to-digital converter 300 of the invention shifts sampled analog input signal by $V_{REF}/2$, i.e. shifts operation range of the analog input signal, thereby reducing the switching energy by considerable little amount compared with the convention technique.

Figure 6:
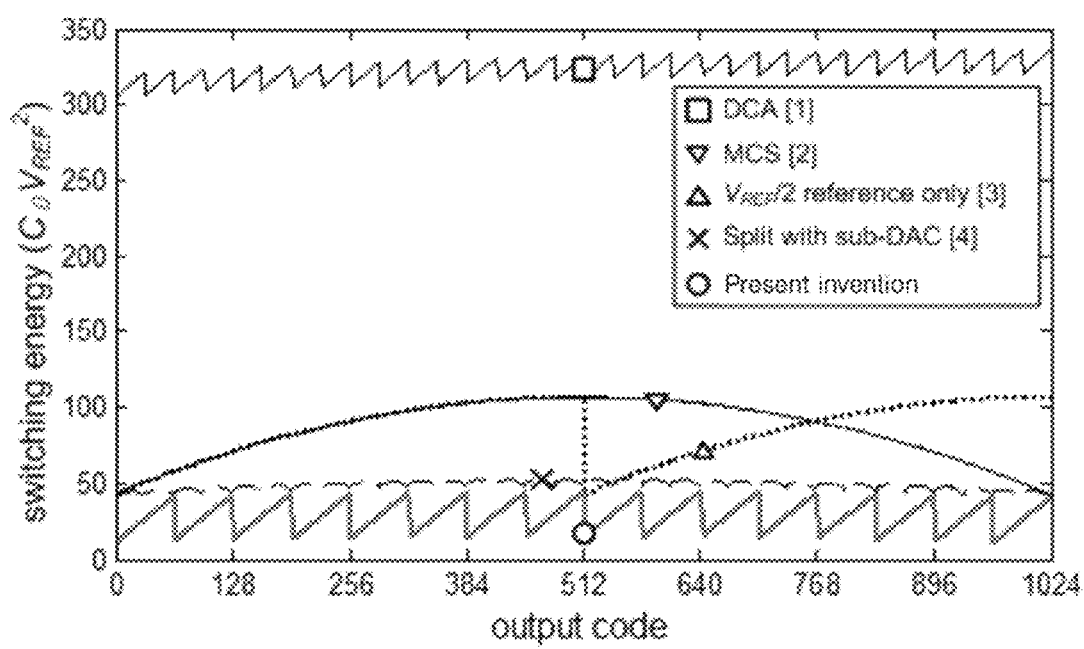
FIG. 6 is a view illustrating simulation result of the successive approximation register analog-to-digital converter according to one embodiment of the invention.

FIG. 6 is a view illustrating simulation result of the successive approximation register analog-to-digital converter according to one embodiment of the invention.

Referring to FIG. 6, it is verified through MATLAB simulation result that the successive approximation register analog-to-digital converter 300 of the invention has very low switching energy compared with the conventional successive approximation register analog-to-digital converter having single-ended structure.

Referring to following Table 1, it is verified that average switching energy in the successive approximation register analog-to-digital converter 300 reduces by least 42.7% and maximum 91.3% compared with other conventional techniques.

TABLE 1

| Switching Procedure | Average switching energy ($C_0V_{REF}^2$) | Energy Saving (%) |
| --- | --- | --- |
| DCA | 323.0 | 0 |
| MCS | 85.3 | 73.6 |
| $V_{REF}/2$ reference only | 84.7 | 73.7 |
| Split with sub-DAC | 49.1 | 84.8 |
| The present invention | 28.1 | 91.3 |

The embodiments of the invention described above are disclosed only for illustrative purposes. A person having ordinary skill in the art would be able to make various modifications, alterations, and additions without departing from the spirit and scope of the invention, but it is to be appreciated that such modifications, alterations, and additions are encompassed by the scope of claims set forth below.

The invention claimed is:

1. A successive approximation register analog-to-digital converter to perform a sampling operation and a hold operation, the successive approximation register analog-to-digital converter comprising:
    a dual capacitor array configured to include a first capacitor array for converting most significant bits of n bits and a second capacitor array for converting least significant bits of the n bits;
    a comparator configured to compare a level signal outputted from the first capacitor array with a level signal outputted from the second capacitor array;
    an SAR logic circuit configured to convert an analog input voltage into a digital signal having the n bits by using the comparison result; and
    a first MOS switch and a second MOS switch configured to shift the analog input voltage sampled in the sampling operation,
    wherein the first capacitor array includes a 1-1 capacitor circuit and a 1-2 capacitor circuit and the second capacitor array includes a 2-1 capacitor circuit and a 2-2 capacitor circuit, and
    wherein each of the capacitor circuits includes capacitors connected in parallel each other.

2. The successive approximation register analog-to-digital converter of claim 1, wherein one of the analog input voltage to a reference voltage is applied to one terminals of capacitors in the 1-1 capacitor circuit, one of the analog input voltage to a ground voltage is applied to one terminals of capacitors in the 1-2 capacitor circuit, the other terminals of the capacitors in the 1-1 capacitor circuit and the other terminals in the 1-2 capacitor circuit are connected to a first input terminal of the comparator, the reference voltage is applied to a source electrode of the first MOS switch, a drain electrode of the first MOS switch is connected to the first input terminal of the comparator, and one of voltages corresponding to K times the ground voltage to the analog input voltage is applied to a gate electrode of the first MOS switch.

3. The successive approximation register analog-to-digital converter of claim 2, wherein in the sampling operation, the analog input voltage is applied to the one terminals of the capacitors in the 1-1 capacitor circuit and the one terminals of the capacitors in the 1-2 capacitor circuit and the ground voltage is applied to the gate electrode of the first MOS switch, and in the hold operation, the reference voltage is applied to the one terminals of the capacitor in the 1-1 capacitor circuit, the one terminals of the capacitors in the 1-2 capacitor circuit are connected to a ground, and a voltage corresponding to K times the analog input voltage is applied to the gate electrode of the first MOS switch.

4. The successive approximation register analog-to-digital converter of claim 1, wherein a reference voltage is applied to one terminals of capacitors in the 2-1 capacitor circuit, a ground voltage is applied to one terminals of capacitors in the 2-2 capacitor circuit, the other terminals of the capacitors in the 2-1 capacitor circuit and the other terminals of the capacitors in the 2-2 capacitor circuit are connected to a second input terminal of the comparator, the reference voltage is applied to a source electrode of the second MOS switch, a drain electrode of the second MOS switch is connected to the second input terminal of the comparator, and one of the ground voltage to the analog input voltage is applied to a gate electrode of the second MOS switch.

5. The successive approximation register analog-to-digital converter of claim 4, wherein the ground voltage is applied to a gate electrode of the second MOS switch in the sampling operation, and the analog input voltage is applied to the gate electrode of the second MOS switch in the hold operation.

6. A successive approximation register analog-to-digital converter comprising:

a dual capacitor array configured to include a first capacitor array for converting most significant bits and a second capacitor array for converting least significant bits;

a comparator configured to compare a level signal outputted from the first capacitor array with a level signal outputted from the second capacitor array; and an SAR logic circuit configured to convert an analog input voltage into a digital signal having n bit by using the comparison result, wherein the first capacitor array includes a 1-1 capacitor circuit and a 1-2 capacitor circuit, each of the capacitor circuits includes capacitors connected in parallel each other, the successive approximation register analog-to-digital converter performs a sampling operation and a hold operation, and wherein the analog input voltage is applied to one terminals of capacitors in the 1-1 capacitor circuit and one terminals of capacitors in the 1-2 capacitor circuit in the sampling operation, and a reference voltage is applied to the one terminals of the capacitors in the 1-1 capacitor circuit and the one terminals of the capacitors in the 1-2 capacitor circuit are connected to a ground in the hold operation.

* * * * *